(12) United States Patent
Tamaki et al.

(10) Patent No.: US 6,882,542 B2
(45) Date of Patent: Apr. 19, 2005

(54) ELECTRONIC APPARATUS

(75) Inventors: Naoya Tamaki, Tokyo (JP); Norio Masuda, Tokyo (JP); Toshihide Kuriyama, Tokyo (JP); Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 10/663,797

(22) Filed: Sep. 17, 2003

(65) Prior Publication Data

US 2004/0057220 A1 Mar. 25, 2004

(30) Foreign Application Priority Data

Sep. 19, 2002 (JP) ........................................ 2002-273536

(51) Int. Cl.⁷ ............................. H05K 7/02; H05K 7/06; H05K 7/08; H05K 7/10
(52) U.S. Cl. ...................................... 361/760; 361/777
(58) Field of Search ................................ 361/760, 777, 361/806–810, 780, 794; 174/254–256; 257/734–738; 315/169.4

(56) References Cited

U.S. PATENT DOCUMENTS

| | | | | |
|---|---|---|---|---|
| 5,574,630 A | * | 11/1996 | Kresge et al. | ............... 361/792 |
| 5,640,048 A | * | 6/1997 | Selna | ........................... 257/738 |
| 6,407,930 B1 | * | 6/2002 | Hsu | ............................. 361/784 |
| 6,703,792 B1 | * | 3/2004 | Kawada et al. | ........... 315/169.4 |

FOREIGN PATENT DOCUMENTS

| | | |
|---|---|---|
| JP | 2001-102817 | 4/2001 |
| JP | 2001-320208 | 11/2001 |

* cited by examiner

*Primary Examiner*—Kamand Cuneo
*Assistant Examiner*—Tuan Dinh
(74) *Attorney, Agent, or Firm*—Young & Thompson

(57) ABSTRACT

An electronic apparatus comprises a function module having a multilayer wiring unit including a first signal wiring corresponding to an internal layer wiring, a first signal via, a first reference potential wiring, a first signal pad to which the first signal wiring is connected through the first signal via, a first reference potential pad that surrounds the periphery of the first signal pad and to which the first reference potential wiring is connected, and a first reference potential connected to the first reference potential pad; a inultilayer circuit board; a first conductor; and a second conductor.

10 Claims, 15 Drawing Sheets

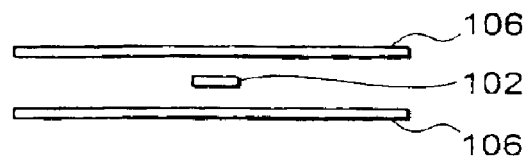
FIG. 6A
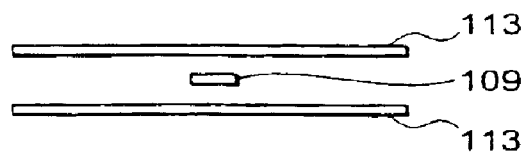
FIG. 6B
FIG. 7
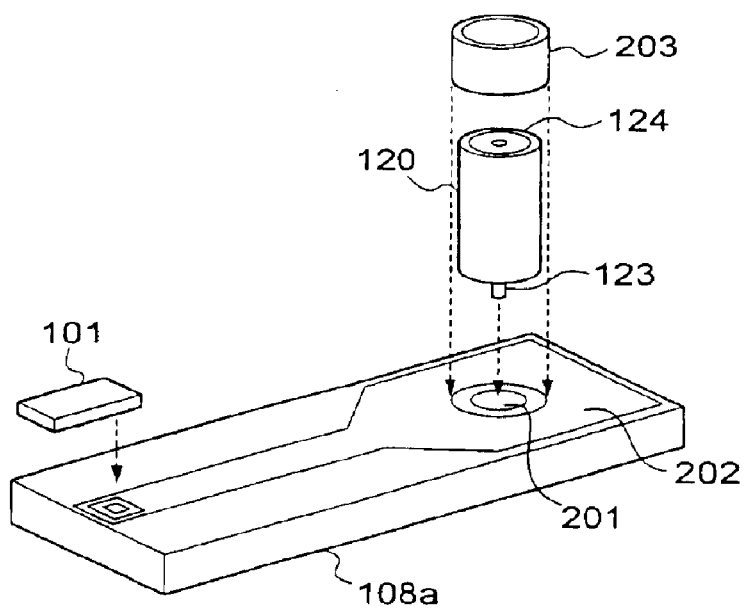

ELECTRONIC APPARATUS

BACKGROUND OF THE INVENTION

1. Field of the Invention

The present invention relates to an electronic apparatus, and particularly to an electronic apparatus provided with a function module such as a sensor, and a multilayer circuit board for trunk connecting an output signal wiring of the function module to a coaxial cable.

2. Description of the Prior Art

A configuration shown in FIG. 21 will be explained as one for a sensor device of a prior art example. FIG. 21 is a perspective view showing the sensor device of the prior art example. In a sensor module 2001 used as a function module, one end of a signal wiring 2003 of a multilayer wiring unit thin-film formed on the surface of a substrate is connected to a signal pad 2004, and one end of each ground wiring 2005 of the multilayer wiring unit is connected to a ground pad 2006. When the signal wiring 2003 is now located within an internal layer, the signal wiring 2003 is led to the top layer through a via. In a multilayer wiring board 2002, one end of a signal wiring 2007 is connected to a signal pad 2008, and the other end thereof is connected to a signal pad 2013, whereas one end of each ground wiring 2009 is connected to its corresponding ground pad 2010, and the other end thereof is connected to its corresponding ground pad 2014. Further, the sensor module 2001 is fixedly secured to the multilayer circuit board 2002. The signal pad 2004 and the signal pad 2008 are connected to each other by a bonding wire 2011, and the ground pads 2006 and the ground pads 2010 are connected to one another by bonding wires 2012 respectively. Then, a central conductor 2016 of a semi-rigid coaxial cable 2015 is connected to the signal pad 2013 by using solder or the like, and an outer conductor 2017 of the semi-rigid coaxial cable 2015 is connected to the ground pad 2014 by use of solder or the like.

Incidentally, a configuration of connecting the multilayer circuit board and the semi-rigid coaxial cable has been disclosed in Japanese Published Unexamined Patent Publication Nos. 2001-102817 and 2001-320208 by way of example.

However, in the configuration of the sensor device illustrative of the prior art example, which is shown in FIG. 21, a problem arises in that sine the multilayer wiring unit of the sensor module 2001, and the signal wirings, pads and bonding wires of the multilayer circuit board 2002 are exposed, they are susceptible to an outcoming noise. Also a problem arises in that a high-frequency signal transmission characteristic is apt to be degraded due to the resistance of each bonding wire and the influence of impedance. Further, a problem arises in that the sensor device is sensitive to a mechanical shock associated with soldering even if an attempt is made to directly solder the sensor module 2001 and the semi-rigid coaxial cable 2015. Moreover, a problem arises in that there is a need to provide a process step for firmly fixing the sensor module 2001 to the multilayer circuit board 2002.

BRIEF SUMMARY OF THE INVENTION

Summary of the Invention

The present invention is intended to solve the above problems. Therefore, according to one aspect of the present invention, there is provided an electronic apparatus comprising a function module having a multilayer wiring unit including a first signal wiring corresponding to an internal layer wiring, a first signal via, a first reference potential wiring, a first signal pad to which the first signal wiring is connected through the first signal via, a first reference potential pad that surrounds the periphery of the first signal pad and to which the first reference potential wiring is connected, and a first reference potential via connected to the first reference potential pad; a multilayer circuit board including a second signal wiring corresponding to an internal layer wiring, a second signal via, a second reference potential wiring, a second signal pad to which one end of the second signal wiring is connected through the second signal via, a second reference potential pad that surrounds the periphery of the second signal pad and to which one end of the second reference potential wiring is connected, a second reference potential via connected to the second reference potential pad, a third signal pad to which the other end of the second signal wiring is connected, and a third reference potential pad to which the other end of the second reference potential wiring is connected; a first conductor that connects the first signal pad and the second signal pad; and a second conductor that connects the first reference potential pad and the second reference potential pad, wherein a central conductor of a coaxial cable is connected to the third signal pad, and an outer conductor of the coaxial cable is connected to the third reference potential pad.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 6A is a cross-sectional view showing a signal wiring and ground wiring portions of the multilayer wiring unit shown in FIG. 3, and FIG. 6B is a cross-sectional view illustrating a signal wiring and ground wiring portions of the multilayer circuit board;

FIG. 7 is an exploded perspective view of an electronic apparatus according to a second embodiment of the present invention;

DETAILED DESCRIPTION OF THE INVENTION

Figure 1:
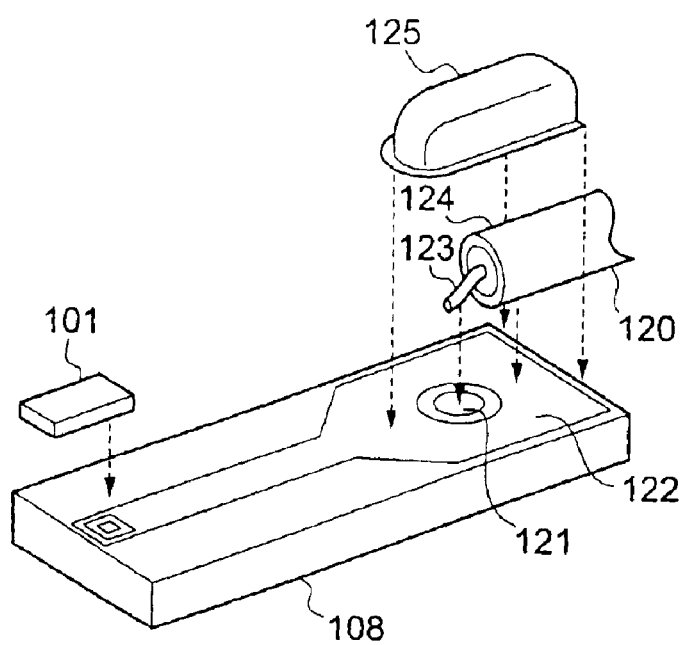
FIG. 1 is an exploded perspective view of an electronic apparatus according to a first embodiment of the present invention.
Figure 2:
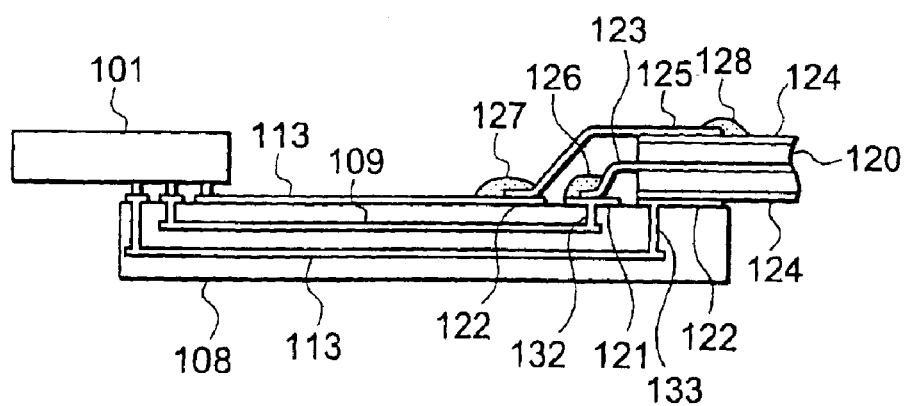
FIG. 2 is a cross-sectional view of the electronic apparatus according to the first embodiment of the present invention.
Figure 4A:
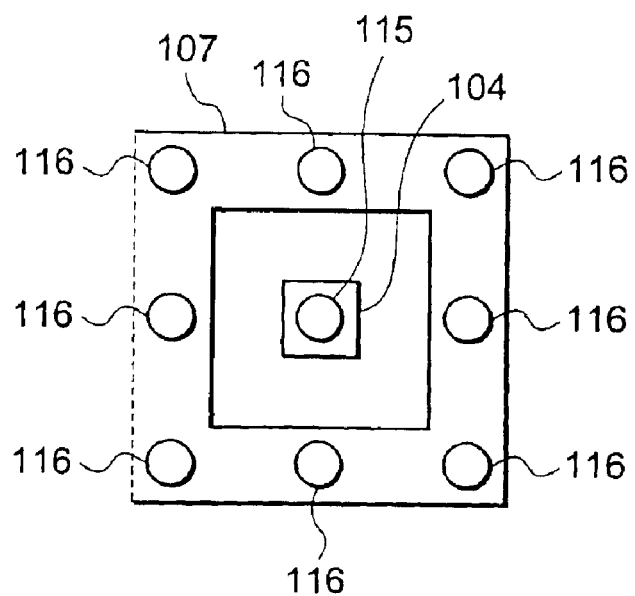
FIG. 4A is a plan view of a pad section of the multilayer wiring unit shown in FIG. 3.
Figure 4B:
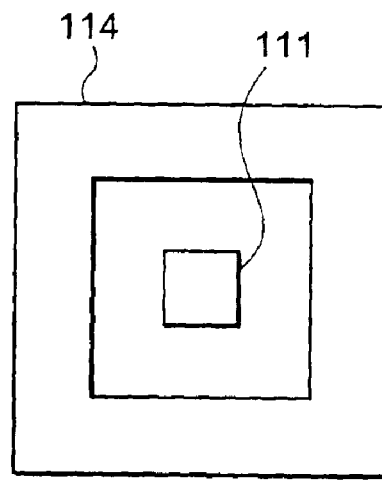
FIG. 4B is a plan view of a pad section of the multilayer circuit board.
Figure 5A:
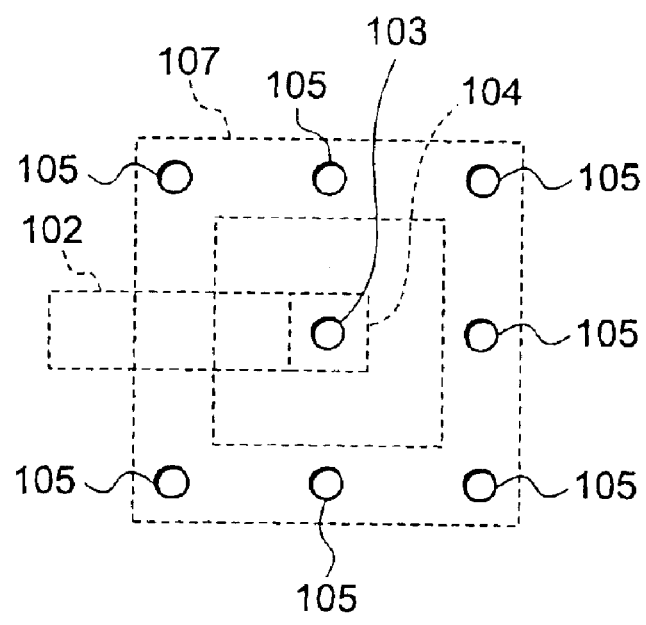
FIG. 5A is a cross-sectional view of a via section of the multilayer wiring unit shown in FIG. 3.
Figure 5B:
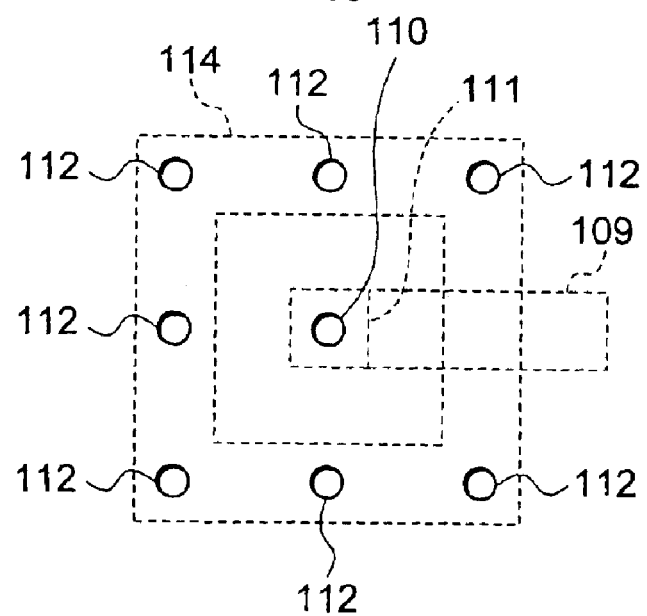
FIG. 5B is a cross-sectional view of a via section of the multilayer circuit board.

A configuration of an electronic apparatus according to a first embodiment of the present invention will next be explained with reference to FIGS. 1 through 6. FIG. 1 is an exploded perspective view showing the electronic apparatus according to the first embodiment of the present invention, FIG. 2 is a cross-sectional view illustrating the electronic apparatus according to the present embodiment, FIG. 3 is a cross-sectional view depicting a section for connection of a multilayer wiring unit and a multilayer circuit board both shown in FIG. 2, FIG. 4A is a plan view showing a pad section of the multilayer wiring unit shown in FIG. 3, FIG. 4B is a plan view showing a pad section of the multilayer circuit board, FIG. 5A is a cross-sectional view illustrating a via section of the multilayer wiring unit shown in FIG. 3, FIG. 5B is a cross-sectional view depicting a via section of the multilayer circuit board, FIG. 6A is a cross-sectional view depicting a signal wiring and ground wiring portions of the multilayer wiring unit shown in FIG. 3, and FIG. 6B is a cross-sectional view illustrating a signal wiring and ground wiring portions of the multilayer circuit board, respectively.

As shown in FIG. 1, the electronic apparatus according to the first embodiment of the present invention is provided with a sensor module 101 used as a function module, and a multilayer circuit board 108 made up of a dielectric material. The sensor module 101 is electrically connected and fixedly secured to one end of the surface of the multilayer circuit board 108. Further, one end of a semi-rigid coaxial cable 120 connected to an external measuring device is connected to the other end of the surface of the multilayer circuit board 108. Furthermore, a connecting portion of the semi-rigid coaxial cable 120 is surrounded by a conductor case 125.

Figure 3:
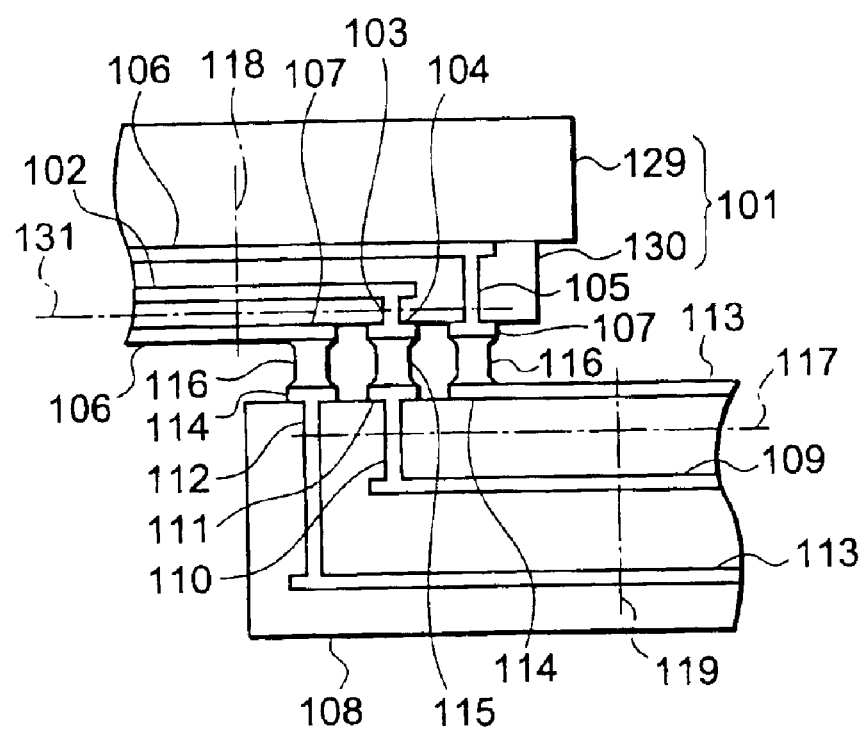
FIG. 3 is a cross-sectional view of a section for connection of a multilayer wiring unit and a multilayer circuit board in FIG. 2.

As shown in FIG. 3, the sensor module 101 includes a substrate 129 corresponding to a glass substrate, a sapphire substrate, a silicon substrate or the like, and a multilayer wiring unit 130 thin-film formed on the surface of the substrate 129.

The multilayer wiring unit 130 includes a signal wiring 102 corresponding to an internal layer wiring, a signal via 103, a signal pad 104, ground vias 105 each used as a reference potential via, two ground wirings 106 each used as a reference potential wiring, and a ground pad 107 used as a reference potential pad.

One of the two ground wirings 106, the signal pad 104 and the ground pad 107 are provided within the same layer of the surface of the multilayer wiring unit 130.

The signal pad 104 is provided with a bump 115 used as a connecting conductor, and the ground pad 107 is provided with bumps 116 used as a connecting conductor.

As shown in FIGS. 2 and 3, the multilayer circuit board 108 includes a signal wiring 109 corresponding to an internal layer wiring, a signal via 110, a signal pad 111, ground vias 112 each used as a reference potential via, two ground wirings 113 used as reference potential wirings, a ground pad 114 used as a reference potential pad, a signal pad 121, a ground pad 122, signal vias 132, and ground vias 133.

The signal pad 111 and the ground pad 114 are provided at one end of the multilayer circuit board 108, whereas the signal pad 121 and the ground pad 122 are provided at the other end of the multilayer circuit board 108.

One of the two ground wirings 113, the signal pad 111, the ground pad 114, the signal pad 121, and the ground pad 122 are provided with in the same layer of the surface of the multilayer circuit board 108. The other of the two ground wirings 113 is provided with in an internal layer of the multilayer circuit board 108.

A configuration of a section for connection of the sensor module 101 and the multilayer circuit board 108 will first be explained.

A signal outputted from a sensor device formed on the substrate 129 is transmitted to one end of the signal wiring 102, and a reference potential of the output signal of the sensor device is transmitted to one end of the corresponding ground wiring 106.

The other end of the signal wiring 102 is connected to the signal pad 104 through the signal via 103. The other end of the ground wiring 106 on the surface side is connected to the ground pad 107. The other end of the ground wiring 106 on the internal layer side is connected to the ground pad 107 through the ground via 105.

On the other hand, one end of the signal wiring 109 is connected to the signal pad 111 through the signal via 110, and the other end thereof is connected to the signal pad 121 through the signal via 132.

One end of the ground wiring 113 on the surface side is connected to the ground pad 114, and the other end thereof is connected to the ground pad 122. One end of the ground wiring 113 on the internal layer side is connected to the ground pad 114 through the ground via 112, and the other end thereof is connected to the ground pad 122 through the ground via 133.

Further, the signal pad 104 and the signal pad 111 are connected to each other by the bump 115, whereas the ground pad 107 and the ground pad 114 are connected to each other by the bumps 116.

The size and position of the bump 115 are set in such a manner that the bump 115 is not extended out of the signal pad 104 and the signal pad 111 and does not make short-circuits with the bumps 116, the ground pad 107 and the ground pad 114 after their connections.

As shown in FIG. 4A, the ground pad 107 surrounds the periphery of the signal pad 104 in the multilayer wiring unit 130. The bump 115 is provided on the surface of the signal pad 104, and a plurality of the bumps 116 (eight bumps in the present embodiment) are provided on the surface of the ground pad 107. As shown in FIG. 4B, the ground pad 114 surrounds the periphery of the signal pad 111 in the multilayer circuit board 108.

The signal pad 104 and the signal pad 111 may preferably be identical to each other in size. The interval between the signal pad 104 and the ground pad 107 and the interval between the signal pad 111 and the ground pad 114 may preferably be identical. Thus, alignment becomes easy upon bump connections, and continuity of a wiring structure is held as much as possible after the bump connections to thereby suppress disturbance of an electromagnetic field, thus enhancing a high-frequency characteristic.

The via may preferably be disposed in the center of its corresponding pad. In the case of plural vias, they may preferably be disposed point-symmetrically with respect to the center of the pad.

Though the plurality of bumps 116 provided on the ground pad 107 are disposed so as to surround the bump 115, the plurality of bumps 116 may preferably be disposed such that the adjacent bumps 116 are spaced uniformly.

FIG. 5A is a cross-sectional view showing the via section of the multilayer wiring unit 130 at the position of an alternate long and short dash line 131. The seven ground vias 105 connected to their corresponding ground pad 107 surround the signal via 103. Here, no ground via 105 is disposed at a passing portion of the signal wiring 102 to avoid a short circuit between the signal wiring 102 and the corresponding ground via 105. FIG. 5B is a cross-sectional view showing the via section of the multilayer circuit board 108 at the position of an alternate long and short dash line 117. The seven ground vias 112 connected to the ground pad 114 surround the signal via 110. Here, no ground via 112 is disposed at a passing portion of the signal wiring 109 to avoid a short circuit between the signal wiring 109 and the corresponding ground via 112.

The numbers and layouts of the ground vias 105 and ground vias 112 are not necessarily limited to above. The numbers thereof are increased as many as possible and they may preferably be provided at equal intervals.

FIG. 6A is a cross-sectional view showing the signal wiring 102 and ground wiring 106 portions of the multilayer wiring unit 130 at the position of an alternate long and dash line 118. The signal wiring 102 takes a strip line structure in which it is interposed between the two ground wirings 106 corresponding to its upper and lower conductor layers. Here, a pattern width of the ground wiring 106 is set larger than that of the signal wiring 102. FIG. 6B is a cross-sectional view showing the signal wiring 109 and the ground wiring 113 portions of the multilayer circuit board 108 at the position of an alternate long and dash line 119. The signal wiring 109 has a strip line structure in which it is interposed between the two ground wirings 113 corresponding to its upper and lower conductor layers. Here, a pattern width of the ground wiring 113 is set larger than that of the signal wiring 109.

A configuration of a section for connection of the multilayer circuit board 108 and the semi-rigid coaxial cable 120 will next be explained.

As shown in FIGS. 1 and 2, a central conductor 123 of the semi-rigid coaxial cable 120 is connected to the signal pad 121 by solder 126. An outer conductor 124 of the semi-rigid coaxial cable 120 is solder-connected to the ground pad 122.

Further, the conductor case 125 is connected to the ground ad 122 by solder 127 so as to cover and surround a connecting portion of the central conductor 123. Moreover, the conductor case 125 is connected to the outer conductor 124 by solder 128. Here, the ground pad 122, the outer conductor 124 and the conductor case 125 may preferably solder-connected to one another without any clearance.

An effect of the present embodiment will next be described. First of all, the sensor module 101 and the multilayer circuit board 108 are configured so as to be connected to each other by the bump 115 and the bumps 116. Consequently, the space for mounting the sensor module 101 on the multilayer circuit board 108 can be reduced. Since they are connected to each other at an extremely short distance, a transmission loss or delay or the like developed due to an inductance component and a resistance component included in a bonding wire, which are produced in the conventional example, can be suppressed. Since an electrical connection between the sensor module 101 and the multilayer circuit board 108 by the bump 115 and the bumps 116, and their fixing (mechanical connection) are performed simultaneously, an assembly process for fixedly securing the sensor module onto the multilayer circuit board, which is required in the conventional example, can be eliminated.

Further, since the signal pad 104 connected to the signal wiring 102 is surrounded by the ground pad 107 connected to the ground wiring 106, and the signal pad 111 connected to the signal wiring 109 is surrounded by ground pad 114 connected to the ground wiring 113, electromagnetic interference of a sensor output signal with an outcoming noise or another wiring signal can be suppressed. Since the bump 115 and the bumps 116 can be concentratedly provided, it is possible to enhance the stability of conduction and mechanical strength.

Next, since the bump 115 connected to the signal wiring 102 and the signal wiring 109 is configured so as to be surrounded by the bumps 116 connected to the ground wirings 106 and the ground wirings 113, shield performance of a bump connecting section is enhanced and hence electromagnetic interference of a sensor output signal with an outcoming noise or another wiring signal can be suppressed. Since the bumps 116 connected to the ground wirings 106 and the ground wirings 113 provide a large suppression effect as the distance between the adjacent bumps becomes smaller, they may preferably be disposed as close to each other as possible.

Next, since the signal via 103 connected to the signal wiring 102 is surrounded by the ground vias 105, and the signal via 110 connected to the signal wiring 109 is surrounded by the ground vias 112, shield performance of a via layer section is enhanced and hence electromagnetic interference of a sensor output signal with an outcoming noise or another wiring signal can be suppressed. Since the ground vias 105 connected to the corresponding ground wiring 106, and the ground vias 112 connected to the corresponding ground wiring 113 respectively provide large suppression effects as the distance between the adjacent vias becomes smaller, they may preferably be disposed as close to each other as possible.

Although, in the present embodiment, both the multilayer wiring unit 130 and the multilayer circuit board 108 are respectively configured such that the signal vias are surrounded by the ground vias, at least one of the multilayer wiring unit 130 and the multilayer circuit board 108 may be configured such that the signal via is surrounded by the ground vias, whereby the above effect commensurate with it can be obtained.

Further, since the bump 115 and bumps 116 for connection are provided in large numbers, the impedance of each connecting portion is reduced so that the stability of a circuit operation and mechanical strength can be enhanced.

Next, since the internal-layer signal wiring 102 of the multilayer wiring unit 130 is configured as the strip line structure with being interposed between the two ground wirings 106 corresponding to its upper and lower conductor layers, and the internal-layer signal wiring 109 of the multilayer circuit board 108 is configured as the strip line structure with being interposed between the two ground wirings 113 corresponding to its upper and lower conductor layers, shield performance of a link wiring section is enhanced, so that electromagnetic interference of a sensor output signal with an outcoming noise or another wiring signal can be suppressed. Since the characteristic impedance of each wiring can easily be designed, a reflection loss due to impedance mismatching is suppressed so that a high-frequency signal transmission characteristic can be made satisfactory.

Although, in the present embodiment, the signal wirings are configured as the strip line structures with being interposed between the two ground wirings, respectively, in both the multilayer wiring unit 130 and the multilayer circuit board 108, the signal wiring may be configured as the strip line structure with being interposed between the two ground wirings in at least one of the multilayer wiring unit 130 and the multilayer circuit board 108, whereby the above effect commensurate with it can be obtained.

Next, since the section for connection of the signal pad 121 of the multilayer circuit board 108 and the central conductor 123 of the semi-rigid coaxial cable 120 is hermetically sealed with being surrounded by the conductor case 125, the performance of shielding against an outcoming noise can be enhanced. Since the conductor case is connected to the ground pad 122 of the multilayer circuit board 108 and the outer conductor 124 of the semi-rigid coaxial cable 120, the shield performance can be further enhanced. Since the conductor case 125 additionally functions as part of the ground wiring, impedance matching becomes satisfactory so that a ground potential can be stabilized and a high-frequency signal transmission characteristic can be enhanced. It is also possible to increase the mechanical strength of the connecting section of the semi-rigid coaxial cable 120.

As described above, the electronic apparatus is realized wherein the signal wiring corresponding to the internal layer wiring of the thin-film formed multilayer wiring unit of the function module such as the sensor is connected to the coaxial cable with the satisfactory high-frequency signal transmission characteristic without being affected by the outcoming noise, and simultaneously the function module is firmly fixed to the multilayer wiring board.

A configuration of an electronic apparatus according to a second embodiment of the present invention will next be explained with reference to FIGS. 7 and 8. FIG. 7 is an exploded perspective view showing the electronic apparatus according to the second embodiment of the present invention, and FIG. 8 is a cross-sectional view illustrating the electronic apparatus according to the second embodiment of the present invention.

The difference between the configuration of the electronic apparatus according to the present embodiment and the configuration of the electronic apparatus according to the first embodiment of the present invention shown in FIGS. 1 through 6 resides only in that the connecting configuration of the semi-rigid coaxial cable 120 is changed and the multilayer circuit board 108 is changed to a multilayer circuit board 108a. The electronic apparatus according to the present embodiment is identical in other components of structure to the electronic apparatus according to the first embodiment. Therefore, the same components of structure in the configuration shown in FIGS. 7 and 8 and the configuration shown in FIGS. 1 through 6 are respectively identified by the same reference numerals, and their description will therefore be omitted.

As shown in FIG. 7, the electronic apparatus according to the second embodiment of the present invention includes a sensor module 101 and the multilayer circuit board 108a. The sensor module 101 is electrically connected and fixed to one end of the surface of the multilayer circuit board 108a. Further, one end of the semi-rigid coaxial cable 120 connected to an external measuring device is connected to the other end of the surface of the multilayer circuit board 108a. Moreover, a connecting section of the semi-rigid coaxial cable 120 is surrounded by a conductor case 203.

Figure 8:
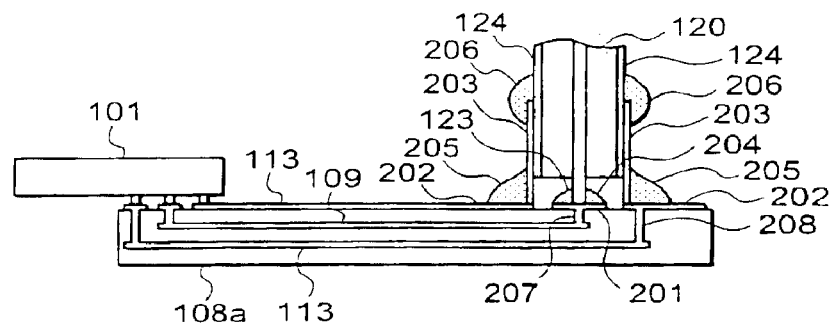
FIG. 8 is a cross-sectional view of the electronic apparatus according to the second embodiment of the present invention.

As shown in FIG. 8, the multilayer circuit board 108a includes a signal pad 201 used in place of the signal pad 121, a ground pad 202 used in place of the ground pad 122, signal vias 207 used in place of the signal vias 132, and ground vias 208 used in place of the ground vias 133.

The other end of the signal wiring 109 is connected to the signal pad 201 through the signal via 207. The other end of a ground wiring 113 on the surface side is connected to its corresponding ground pad 202. The other end of a ground wiring 113 on the internal layer side is connected to its corresponding ground pad 202 through the ground via 208.

A central conductor 123 of the semi-rigid coaxial cable 120 is connected to the signal pad 201 by solder 204. Then, the end of the conductor case 203 is adhered to the ground pad 202 such that the semi-rigid coaxial cable 120 is allowed to pass through a hollow portion of the hollow cylindrical conductor case 203 and thereby the conductor case 203 covers and surrounds a connecting portion of the central conductor 123. Further, the conductor case 203 and the ground pad 202 are connected to each other by solder 205, and the conductor case 203 and an outer conductor 124 of the semi-rigid coaxial cable 120 are connected to each other by solder 206. In this case, the conductor case 203 may preferably be soldered without any clearance.

In the configuration shown in FIGS. 7 and 8, the semi-rigid coaxial cable 120 is connected to the multilayer circuit board 108a at an angle of 90° so as to strike against the multilayer circuit board 108a perpendicular to the multilayer circuit board 108a. However, the present embodiment is not necessarily limited to such an angle. The semi-rigid coaxial cable 120 may be struck against the multilayer circuit board 108a aslant at an arbitrary angle to the multilayer circuit board 108a, and configured as a hollow cylindrical shape in which its end is obliquely cut so as to match with the conductor case 203.

According to the electronic apparatus showing the second embodiment of the present invention, as described above, an effect can be obtained that the electronic apparatus according to the first embodiment of the present invention can be formed as an L-shape type.

Figure 9:
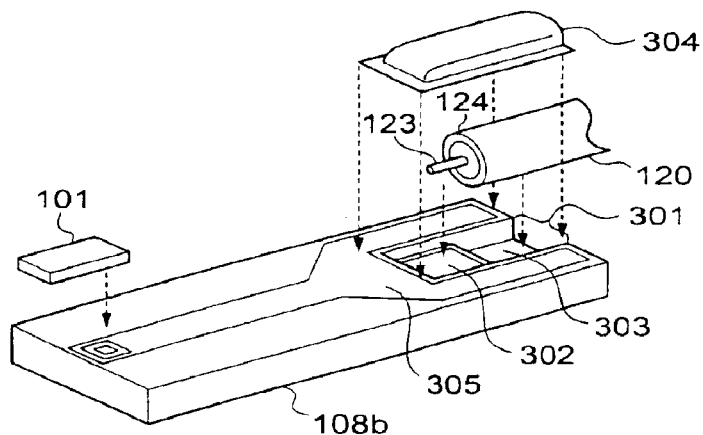
FIG. 9 is an exploded perspective view of an electronic apparatus according to a third embodiment of the present invention.
Figure 10:
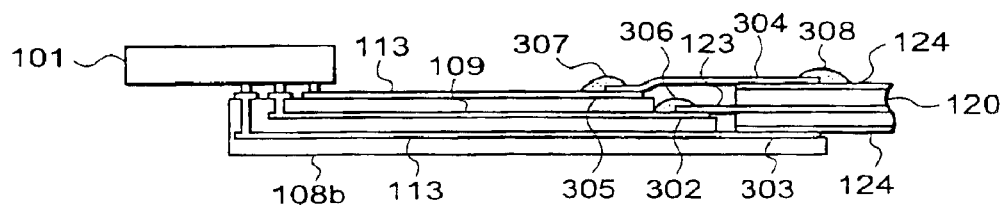
FIG. 10 is a cross-sectional view of the electronic apparatus according to the third embodiment of the present invention.

A configuration of an electronic apparatus according to a third embodiment of the present invention will next be explained with reference to FIGS. 9 and 10. FIG. 9 is an exploded perspective view showing the electronic apparatus according to the third embodiment of the present invention, and FIG. 10 is a cross-sectional view illustrating the electronic apparatus according to the third embodiment of the present invention.

The difference between the configuration of the electronic apparatus according to the present embodiment and the configuration of the electronic apparatus according to the first embodiment of the present invention shown in FIGS. 1 through 6 resides only in that the connecting configuration of the semi-rigid coaxial cable 120 is changed and the multilayer circuit board 108 is changed to a multilayer circuit board 108*b*. The electronic apparatus according to the present embodiment is identical in other components of structure to the electronic apparatus according to the first embodiment. Therefore, the same components of structure in the configuration shown in FIGS. 9 and 10 and the configuration shown in FIGS. 1 through 6 are respectively identified by the same reference numerals, and their description will therefore be omitted.

As shown in FIG. 9, the electronic apparatus according to the third embodiment of the present invention includes a sensor module 101 and the multilayer circuit board 108*b*. The sensor module 101 is electrically connected and fixed to one end of the surface of the multilayer circuit board 108*b*. Further, one end of the semi-rigid coaxial cable 120 connected to an external measuring device is connected to the other end of the surface of the multilayer circuit board 108*b*. Moreover, a connecting section of the semi-rigid coaxial cable 120 is surrounded by a conductor case 304.

The multilayer circuit board 108*b* is provided with a stair structure 301 formed in the neighborhood of one end thereof. As shown in FIG. 10, the multilayer circuit board 108*b* includes a signal pad 302 used in place of the signal pad 121, and a ground pad 303 and a ground pad 305 used in place of the ground pad 122.

The signal pad 302 is provided at a stair surface located one step below as viewed from the surface of the multilayer circuit board 108*b* of the stair structure 301. The ground pad 303 is provided at a stair surface located two steps below as viewed from the surface of the multilayer circuit board 108*b* of the stair structure 301.

The other end of a signal wiring 109 is connected to the signal pad 302. The other end of a ground wiring 113 on the surface side is connected to the ground pad 305. The other end of a ground wiring 113 on the internal layer side is connected to the ground pad 303.

A central conductor 123 of a semi-rigid coaxial cable 120 is connected to the signal pad 302 by solder 306. An outer conductor 124 of the semi-rigid coaxial cable 120 is connected to the ground pad 303 by solder. Then the conductor case 304 and a ground pad 305 are connected to each other by solder 307, and the conductor case 304 and the outer conductor 124 of the semi-rigid coaxial cable 120 are connected to each other by solder 308, in such a manner that the conductor case 304 covers and surrounds a connecting portion of the central conductor 123. In this case, the conductor case 304 may preferably be soldered without any clearance.

According to the electronic apparatus showing the third embodiment of the present invention, as described above, an effect is obtained that the electronic apparatus according to the first embodiment of the present invention can be made thinner in shape.

Figure 11:
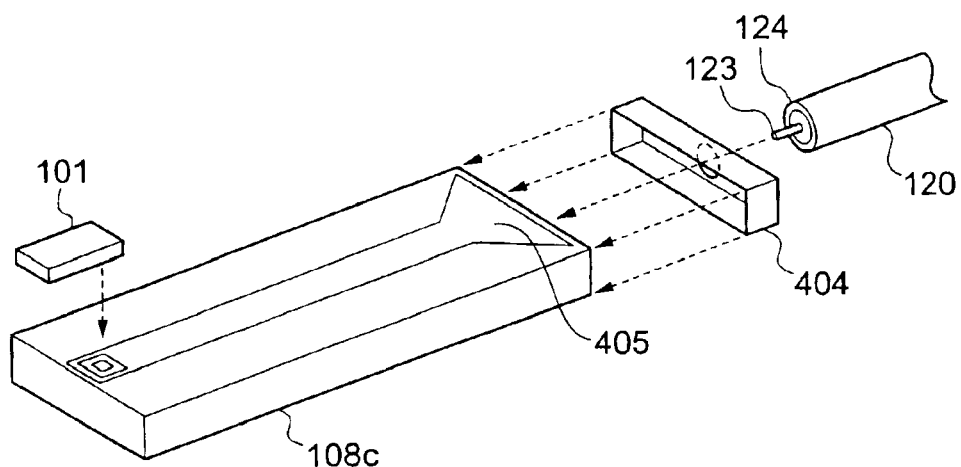
FIG. 11 is an exploded perspective view of an electronic apparatus according to a fourth embodiment of the present invention.

A configuration of an electronic apparatus according to a fourth embodiment of the present invention will next be explained with reference to FIGS. 11 and 12. FIG. 11 is an exploded perspective view showing the electronic apparatus according to the fourth embodiment of the present invention, and FIG. 12 is a cross-sectional view illustrating the electronic apparatus according to the fourth embodiment of the present invention.

The difference between the configuration of the electronic apparatus according to the present embodiment and the configuration of the electronic apparatus according to the first embodiment of the present invention shown in FIGS. 1 through 6 resides only in that the connecting configuration of the semi-rigid coaxial cable 120 is changed and the multilayer circuit board 108 is changed to a multilayer circuit board 108*c*. The electronic apparatus according to the present embodiment is identical in other components of structure to the electronic apparatus according to the first embodiment. Therefore, the same components of structure in the configuration shown in FIGS. 11 and 12 and the configuration shown in FIGS. 1 through 6 are respectively identified by the same reference numerals, and their description will therefore be omitted.

As shown in FIG. 11, the electronic apparatus according to the fourth embodiment of the present invention includes a sensor module 101 and the multilayer circuit board 108*c*. The sensor module 101 is electrically connected and fixed to one end of the surface of the multilayer circuit board 108*c*. Further, one end of the semi-rigid coaxial cable 120 connected to an external measuring device is connected to the other end of the surface of the multilayer circuit board 108*c*. Moreover, a connecting section of the semi-rigid coaxial cable 120 is surrounded by a conductor case 404.

Figure 12:
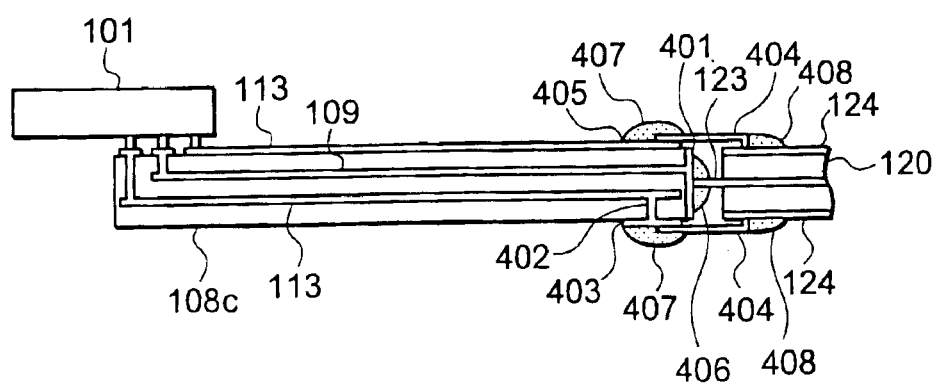
FIG. 12 is a cross-sectional view of the electronic apparatus according to the fourth embodiment of the present invention.

As shown in FIG. 12, the multilayer circuit board 108*c* includes a signal pad 401 used in place of the signal pad 121, a ground pad 403 and a ground pad 405 used in place of the ground pad 122, and a ground via 402 used in place of the ground vias 133.

The signal pad 401 is provided at an end surface of the multilayer circuit board 108*c*. The ground pad 403 is provided on the surface of the multilayer circuit board 108*c* opposite to a ground wiring 113 on the surface side.

The other end of a signal wiring 109 is connected to the signal pad 401. The other end of the ground wiring 113 on the surface side is connected to the ground pad 405. The other end of a ground wiring 113 on the internal layer side is connected to the ground pad 403 through the ground via 402.

A central conductor 123 of a semi-rigid coaxial cable 120 is connected to the signal pad 401 by solder 406. A hole is defined in the conductor case 404, and the semi-rigid coaxial cable 120 is allowed to pass through the hole. Then, the ends of the conductor case 404 are superimposed on their corresponding parts of the ground pad 403 and the ground pad 405 such that the conductor case 404 covers and surrounds a connecting portion of the central conductor 123. In this state, the conductor case 404 and the ground pad 403 and ground pad 405 are connected to one another by solders 407, and the conductor case 404 and an outer conductor 124 of the semi-rigid coaxial cable 120 are connected to each other by solder 408. In this case, the conductor case 404 may preferably be soldered without any clearance.

According to the electronic apparatus showing the fourth embodiment of the present invention, as described above, an effect is obtained that the electronic apparatus according to the third embodiment of the present invention can be made thinner in shape.

Figure 13:
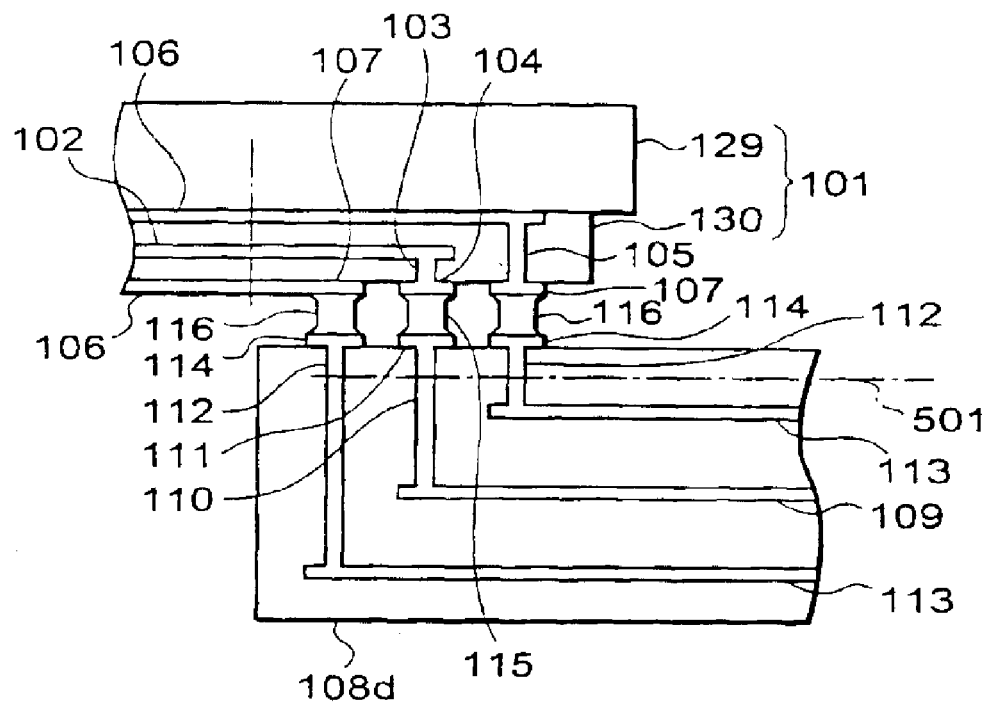
FIG. 13 is a cross-sectional view showing a section for connection of a multilayer wiring unit and a multilayer circuit board employed in an electronic apparatus according to a fifth embodiment of the present invention.

A configuration of an electronic apparatus according to a fifth embodiment of the present invention will next be explained with reference to FIGS. 13 and 14. FIG. 13 is a cross-sectional view showing a section for connection of a multilayer wiring unit and a multilayer circuit board employed in the electronic apparatus according to the fifth embodiment of the present invention, and FIG. 14 is a cross-sectional view showing a via section of the multilayer circuit board shown in FIG. 13.

The difference between the configuration of the electronic apparatus according to the fifth embodiment of the present invention and the configuration of the electronic apparatus according to the first embodiment of the present invention shown in FIGS. 1 through 6 resides only in that the ground wiring 113 on the surface side shown in FIG. 3 is changed to an internal layer wiring as shown in FIG. 13, and the multilayer circuit board 108 is changed to a multilayer circuit board 108d. The electronic apparatus according to the present embodiment is identical in other components of structure to the electronic apparatus according to the first embodiment. Therefore, the same components of structure in the configuration shown in FIGS. 13 and 14 and the configuration shown in FIGS. 1 through 6 are respectively identified by the same reference numerals, and their description will therefore be omitted.

Figure 14:
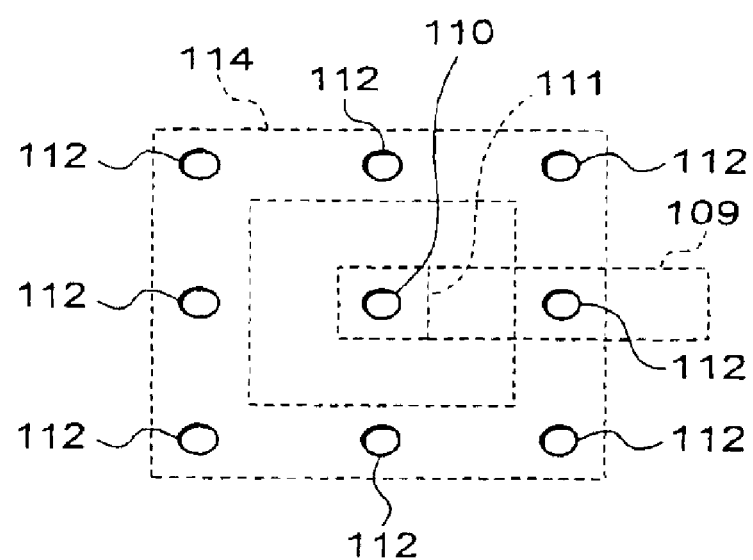
FIG. 14 is a cross-sectional view illustrating a via section of the multilayer circuit board shown in FIG. 13.

FIG. 14 is a cross-sectional view showing a via section of the multilayer circuit board 108d at the position of an alternate long and dash line 501. Eight ground vias 112 surround a signal via 110. Here, since an upper ground wiring 113 serves as an internal layer wiring below the ground via 112, there is no possibility that a signal wiring 109 and the ground via 112 will be short-circuited. A large number of the ground vias 112 can be provided as compared the configuration of the electronic apparatus according to the first embodiment of the present invention shown in FIG. 5B, and the shield performance of a via layer section can be further enhanced.

Incidentally, the number of the ground vias 112 and their layout are not necessarily limited to above. The number thereof is increased as many as possible and the ground vias may preferably be provided at equal intervals.

According to the electronic apparatus showing the fifth embodiment of the present invention, as described above, an effect is obtained that the present electronic apparatus brings about a further satisfactory high-frequency signal transmission characteristic as compared with the electronic apparatus according to the first embodiment of the present invention.

Figure 15:
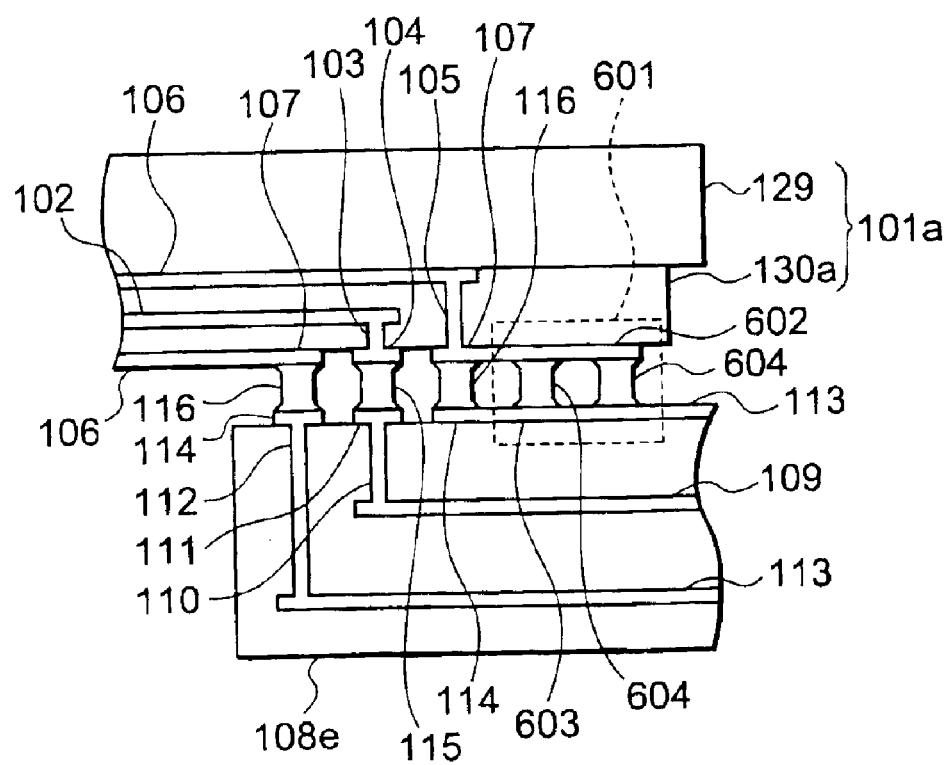
FIG. 15 is a cross-sectional view showing a section for connection of a multilayer wiring unit and a multilayer circuit board employed in an electronic apparatus according to a sixth embodiment of the present invention.

A configuration of an electronic apparatus according to a sixth embodiment of the present invention will next be explained with reference to FIGS. 15 and 16. FIG. 15 is a cross-sectional view showing a section for connection of a multilayer wiring unit and a multilayer circuit board employed in the electronic apparatus according to the sixth embodiment of the present invention, FIG. 16A is a plan view showing a pad section of the multilayer wiring unit shown in FIG. 15, and FIG. 16B is a plan view illustrating a pad section of the multilayer circuit board.

The difference between the configuration of the electronic apparatus according to the sixth embodiment of the present invention and the configuration of the electronic apparatus according to the first embodiment of the present invention shown in FIGS. 1 through 6 resides only in that in areas 601 as shown in FIG. 15, a multilayer wiring unit 130a is provided with a pad 602, a multilayer circuit board 108e is provided with a pad 603 opposite to the pad 602, and bumps 604 used as conductors for connecting the pad 602 and the pad 603 are provided, whereby the sensor module 101 and the multilayer wiring unit 130 are respectively changed to a sensor module 101a and a multilayer wiring unit 130a, and the multilayer circuit board 108 is changed to the multilayer circuit board 108e. The electronic apparatus according to the present embodiment is identical in other components of structure to the electronic apparatus according to the first embodiment. Therefore, the same components of structure in the configuration shown in FIGS. 15 and 16 and the configuration shown in FIGS. 1 through 6 are respectively identified by the same reference numerals, and their description will therefore be omitted.

Figure 16A:
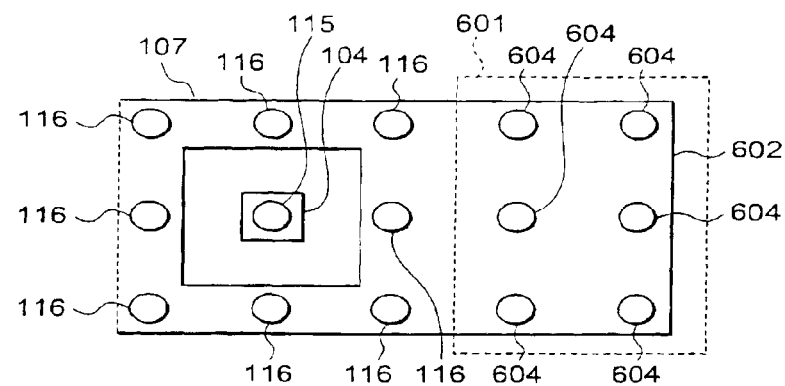
FIG. 16A is a plan view illustrating a pad section of the multilayer wiring unit shown in FIG. 15.
Figure 16B:
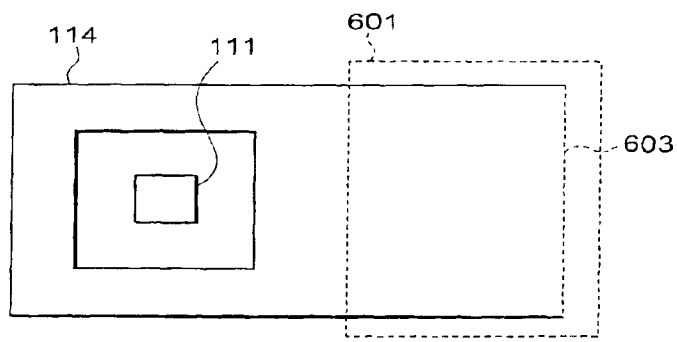
FIG. 16B is a plan view depicting a pad section of the multilayer circuit board.

As shown in FIG. 16A, in the area 601 of the multilayer wiring unit 130a, the pad 602 formed in the same layer as a ground pad 107 is connected to the ground pad 107. As shown in FIG. 16B, the pad 603 formed in the same layer as a ground pad 114 is connected to the ground pad 114 in the area 601 of the multilayer circuit board 108e. Further, the pad 602 and the pad 603 are connected by a plurality of the (six in the present embodiment) bumps 604.

By providing the pad 602 and pad 603 connected to their corresponding ground wirings and increasing the number of bumps for ground connection, a ground potential at a bump connecting section is stabilized so that the stability of the circuit operation of the sensor module 101a is further enhanced. Owing to an increase in the degree of adhesion between the multilayer wiring unit 130a and the multilayer circuit board 108e, mechanical strength is further enhanced and the state of connection of each bump can be held satisfactorily. Since it is further possible to allow heat generated by the sensor module 101a to escape through a number of bumps, dissipation is further enhanced.

Incidentally, the number and layout of the bumps 604 are not necessarily limited to above, and the bumps 604 may preferably be provided as many as possible.

According to the electronic apparatus showing the sixth embodiment of the present invention, as described above, a more satisfactory high-frequency signal transmission characteristic is brought about as compared with the electronic apparatus according to the first embodiment of the present invention. Further, an effect is obtained that the sensor module and the multilayer circuit board are firmly fixed to each other.

Figure 17:
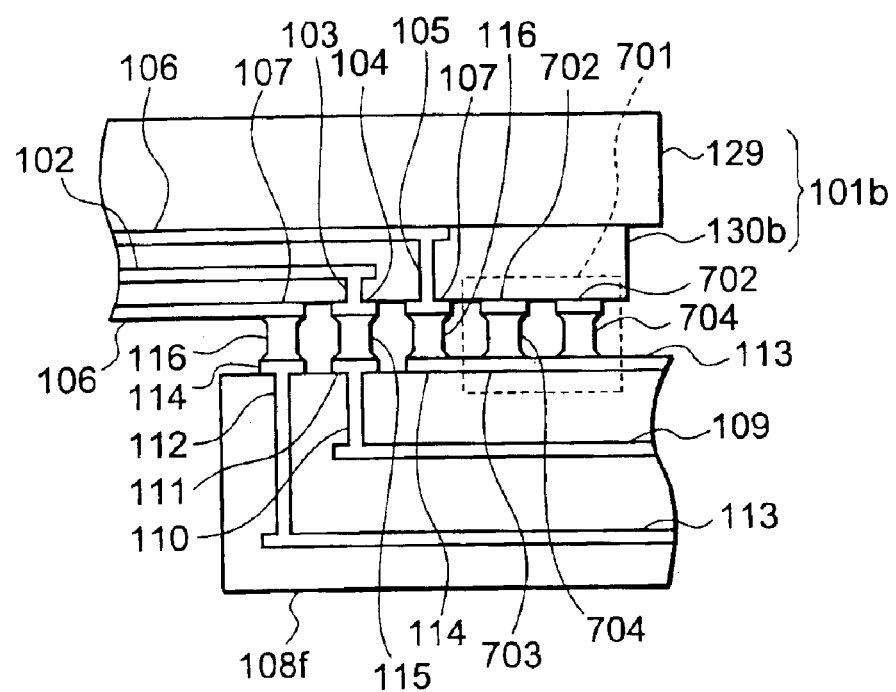
FIG. 17 is a cross-sectional view of a section for connection of a multilayer wiring unit and a multilayer circuit board employed in an electronic apparatus according to a seventh embodiment of the present invention.

A configuration of an electronic apparatus according to a seventh embodiment of the present invention will next be explained with reference to FIGS. 17 and 18. FIG. 17 is a cross-sectional view showing a section for connection of a multilayer wiring unit and a multilayer circuit board employed in the electronic apparatus according to the seventh embodiment of the present invention, FIG. 18A is a plan view showing a pad section of the multilayer wiring unit shown in FIG. 17, and FIG. 18B is a plan view illustrating a pad section of the multilayer circuit board.

The difference between the configuration of the electronic apparatus according to the seventh embodiment of the present invention and the configuration of the electronic apparatus according to the first embodiment of the present invention shown in FIGS. 1 through 6 resides only in that in an area 701 as shown in FIG. 17, a multilayer wiring unit 130b is provided with a pad 702, a multilayer circuit board 108f is provided with a pad 703 opposite to the pad 702, and bumps 704 used as conductors for connecting the pad 702 and the pad 703 are provided, whereby the sensor module 101 and the multilayer wiring unit 130 are respectively changed to a sensor module 101b and a multilayer wiring unit 130b, and the multilayer circuit board 108 is changed to the multilayer circuit board 108f. The electronic apparatus according to the present embodiment is identical in other components of structure to the electronic apparatus according to the first embodiment. Therefore, the same components of structure in the configuration shown in FIGS. 17 and 18 and the configuration shown in FIGS. 1 through 6 are respectively identified by the same reference numerals, and their description will therefore be omitted.

Figure 18A:
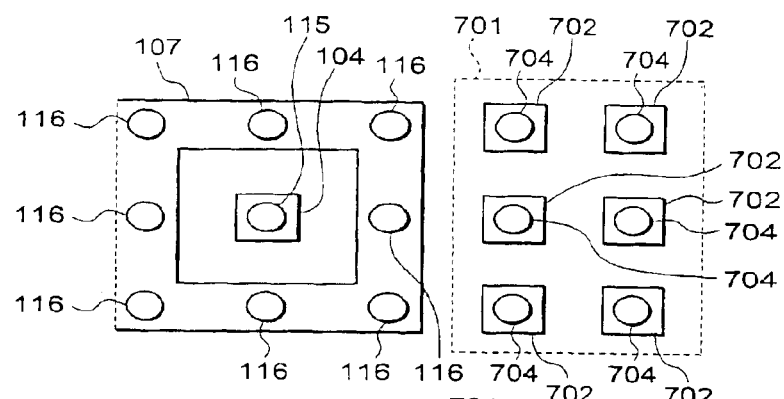
FIG. 18A is a plan view of a pad section of the multilayer wiring unit shown in FIG. 17.
Figure 18B:
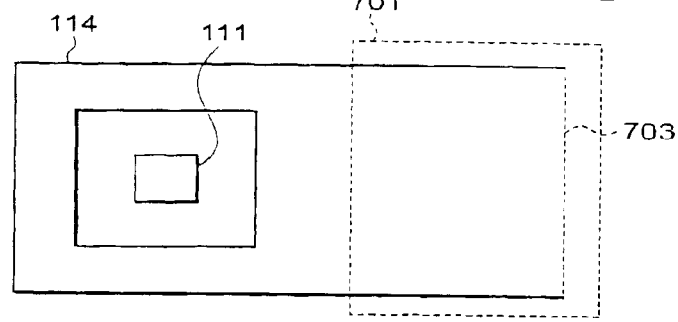
FIG. 18B is a plan view of a pad section of the multilayer circuit.

As shown in FIG. 18A, a plurality of (six in the present embodiment) pads 702 formed in the same layer as a ground pad 107 and electrically disconnected from any ones are provided in the area 701 of the multilayer wiring unit 130b. Also as shown in FIG. 18B, the pad 703 formed in the same layer as a ground pad 114 is connected to the ground pad 114 in the area 701 of the multilayer circuit board 108f. Further, the plurality of (six in the present embodiment) pads 702 and the pad 703 are connected to one another by a plurality of (six in the present embodiment) bumps 704. One bump 704 is provided for each of the plurality of pads 702.

Incidentally, the respective pads 702 are equivalent to ones obtained by dividing the pad 602 shown in FIG. 16A into plural form so as to correspond to the bumps.

Dividing the pad in this way makes it possible to facilitate alignment upon bump packaging in an assembly process. One pad 702 electrically unconnected to any ones, such as being equivalent to the pad 602 shown in FIG. 16A may of course be adopted.

By increasing the number of bumps for mechanical connection and enhancing the degree of adhesion between the multilayer wiring unit 130b and the multilayer circuit board 108f, mechanical strength is further enhanced and the state of connection of each bump can be held satisfactorily. Since it is further possible to allow heat generated by the sensor module 101b to escape through a number of bumps, dissipation is further enhanced.

Incidentally, the numbers and layouts of the pads 702 and bumps 704 are not necessarily limited to above, and the pads and bumps may preferably be provided as many as possible. However, the pads 702 needs at least more than or equal to the number of the bumps 704.

In the present embodiment, the pads electrically unconnected to any ones are provided on the multilayer wiring unit 130b side, the pads connected to their corresponding ground wirings are provided on the multilayer circuit board 108f side. Contrary to this, however, the pads connected to the ground wirings may be provided on the multilayer wiring unit 130b side, and the pads electrically unconnected to any ones maybe provided on the multilayer circuit board 108f side.

According to the electronic apparatus showing the seventh embodiment of the present invention, as described above, an effect is obtained that alignment at bump packaging in an assembly process can further be facilitated as compared with the electronic apparatus according to the sixth embodiment of the present invention.

Figure 19:
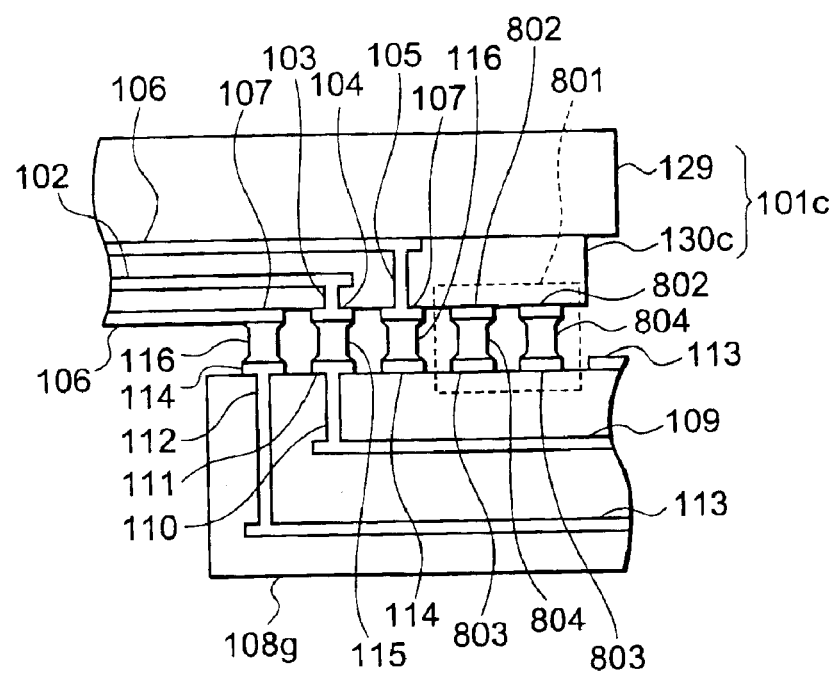
FIG. 19 is a cross-sectional view of a section for connection of a multilayer wiring unit and a multilayer circuit board employed in an electronic apparatus according to an eighth embodiment of the present invention.

A configuration of an electronic apparatus according to an eighth embodiment of the present invention will next be explained with reference to FIGS. 19 and 20. FIG. 19 is a cross-sectional view showing a section for connection of a multilayer wiring unit and a multilayer circuit board employed in the electronic apparatus according to the eighth embodiment of the present invention, FIG. 20A is a plan view showing a pad section of the multilayer wiring unit shown in FIG. 19, and FIG. 20B is a plan view illustrating a pad section of the multilayer circuit board.

The difference between the configuration of the electronic apparatus according to the eighth embodiment of the present invention and the configuration of the electronic apparatus according to the first embodiment of the present invention shown in FIGS. 1 through 6 resides only in that in an area 801 as shown in FIG. 19, a multilayer wiring unit 130c is provided with a pad 802, a multilayer circuit board 108g is provided with a pad 803 opposite to the pad 802, and bumps 804 used as conductors for connecting the pad 802 and the pad 803 are provided, whereby the sensor module 101 and the multilayer wiring unit 130 are respectively changed to a sensor module 101c and a multilayer wiring unit 130c, and the multilayer circuit board 108 is changed to the multilayer circuit board 108g. The electronic apparatus according to the present embodiment is identical in other components of structure to the electronic apparatus according to the first embodiment. Therefore, the same components of structure in the configuration shown in FIGS. 19 and 20 and the configuration shown in FIGS. 1 through 6 are respectively identified by the same reference numerals, and their description will therefore be omitted.

Figure 20A:
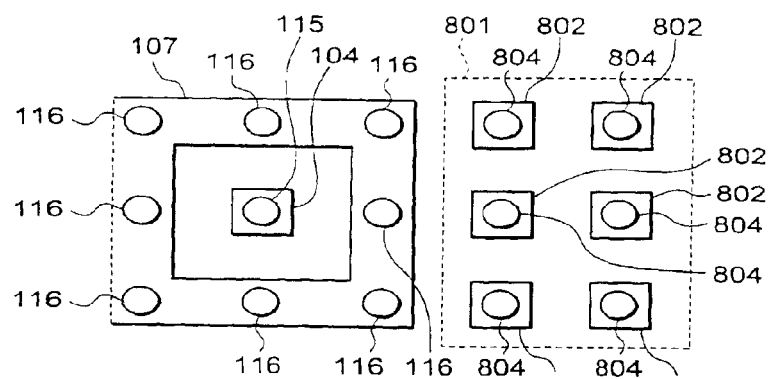
FIG. 20A is a plan view of a pad section of the multilayer wiring unit shown in FIG. 19.
Figure 20B:
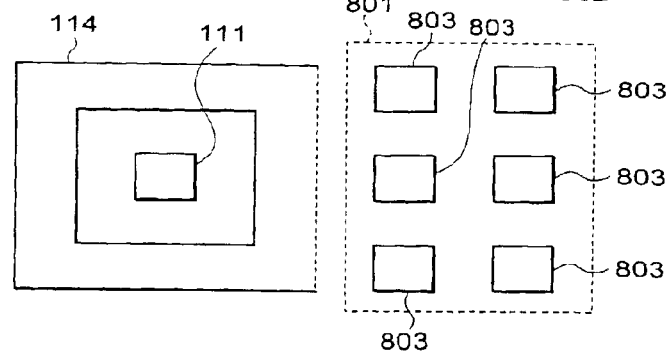
FIG. 20B is a plan view of a pad section of the multilayer circuit board.
Figure 21:
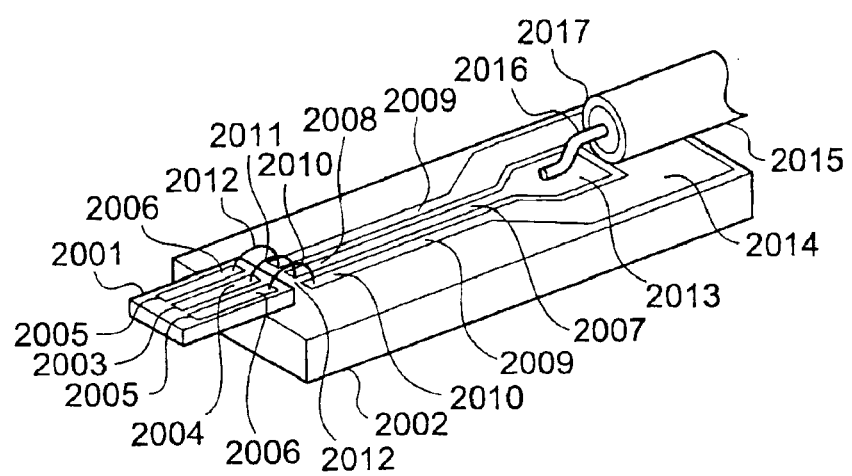
FIG. 21 is a perspective view showing a sensor device according to a prior art example.

As shown in FIG. 20A, a plurality of (six in the present embodiment) pads 802 formed in the same layer as a ground pad 107 and electrically unconnected to any ones are provided in the area 801 of the multilayer wiring unit 130c. Also as shown in FIG. 20B, a plurality of (six in the present embodiment) pads 803 formed in the same layer as a ground pad 114 and electrically unconnected to any ones are provided in the area 801 of the multilayer circuit board 108g. Further, the plurality of (six in the present embodiment) pads 802 and the plurality of (six in the present embodiment) pads 803 are connected in a one-to-one relationship by a plurality of (six in the present embodiment) bumps 804. One bump 804 is provided for each of the plural pads 802.

Incidentally, the respective pads 802 are equivalent to ones obtained by dividing the pad 602 shown in FIG. 16A into plural form so as to correspond to the bumps. The respective pads 803 are equivalent to ones obtained by dividing the pad 603 shown in FIG. 16B into plural form so as to correspond to the bumps.

Owing to the divisions of the pads 802 and 803 into plural form, alignment at bump packaging in an assembly process can be further facilitated as compared with the electronic apparatus according to the seventh embodiment of the present invention. One pad 802 electrically unconnected to any ones, such as being equivalent to the pad 602 shown in FIG. 16A may of course be adopted. One pad 803 electrically unconnected to any ones, such as being equivalent to the pad 603 shown in FIG. 16B may of course be adopted.

By increasing the number of bumps for mechanical connection and enhancing the degree of adhesion between the multilayer wiring unit 130c and the multilayer circuit board 108g, mechanical strength is further enhanced and the state of connection of each bump can be held satisfactorily. Since it is further possible to allow heat generated by a sensor module 101c to escape through a number of bumps, dissipation is further enhanced.

Incidentally, the numbers and layouts of the pads 802, pads 803 and bumps 804 are not necessarily limited to above. They may preferably be provided as many as possible. However, the pads 802 and pads 803 need at least more than or equal to the number of the bumps 804.

According to the electronic apparatus showing the eighth embodiment of the present invention, as described above, an effect is obtained that alignment at bump packaging in an assembly process can further be facilitated as compared with the electronic apparatus according to the seventh embodiment of the present invention.

Incidentally, in any embodiment, the peripheries of the bump connected to the signal pad and the bump connected to the ground pad are sealed with a resin to make it possible to increase mechanical strength of the connection of the multilayer wiring unit and the multilayer circuit board and ensure a high-reliable electrical connection.

Even when only the periphery of the bump connected to the ground pad is sealed with a resin, it is possible to enhance mechanical strength of the connection of the multilayer wiring unit and the multilayer circuit board and ensure a high reliable electrical connection. At this time, the effect of suppressing electromagnetic interference can be enhanced by adding a conductive material to the resin used for sealing.

Although the bumps are used for connection to the signal pad and ground pad in any embodiment, they may be solder balls. Alternatively, the whole surface of each pad may take such a configuration to be connected by solder by means of reflow soldering using print solder. Using solder enables enhancement of connection strength and enhancement of the effect of suppressing electromagnetic interference.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An electronic apparatus comprising:

a function module having a multilayer wiring unit including a first signal wiring corresponding to an internal layer wiring, a first signal via, a first reference potential wiring, a first signal pad to which the first signal wiring is connected through the first signal via, a first reference potential pad that surrounds the periphery of the first signal pad and to which the first reference potential wiring is connected, and a first reference potential via connected to the first reference potential pad;

a multilayer circuit board including a second signal wiring corresponding to an internal layer wiring, a second signal via, a second reference potential wiring, a second signal pad to which one end of the second signal wiring is connected through the second signal via, a second reference potential pad that surrounds the periphery of the second signal pad and to which one end of the second reference potential wiring is connected, a second reference potential via connected to the second reference potential pad, a third signal pad to which the other end of the second signal wiring is connected, and a third reference potential pad to which the other end of the second reference potential wiring is connected;

a first conductor that connects the first signal pad and the second signal pad; and a second conductor that connects the first reference potential pad and the second reference potential pad, wherein a central conductor of a coaxial cable is connected to the third signal pad, and an outer conductor of the coaxial cable is connected to the third reference potential pad.

2. An electronic apparatus according to claim 1, wherein the first conductor is surrounded by a plurality of the second conductors.

3. An electronic apparatus according to claim 1, wherein in at least one of the multilayer wiring unit and the multilayer circuit board, the signal via is surrounded by a plurality of the reference potential vias.

4. An electronic apparatus according to claim 1, wherein in at least one of the multilayer wiring unit and the multilayer circuit board, the signal wiring is nipped by the two reference potential wirings each wider than the signal wiring.

5. An electronic apparatus according to claim 1, wherein the multilayer wiring unit includes a fourth pad connected to the first reference potential pad, and the multilayer circuit board includes a fifth pad connected to the second reference potential pad and is provided with a third conductor that connects the fourth pad and the fifth pad.

6. An electronic apparatus according to claim 1, wherein one of the multilayer wiring unit and the multilayer circuit board includes a fourth pad connected to the reference potential pad, and the other thereof includes a fifth pad unconnected to any ones and is provided with a third conductor that connects the fourth pad and the fifth pad.

7. An electronic apparatus according to claim 1, wherein the multilayer wiring unit includes a fourth pad unconnected to any ones, and the multilayer circuit board includes a fifth pad unconnected to any ones and is provided with a third conductor that connects the fourth pad and the fifth pad.

8. An electronic apparatus according to claim 1, further including a conductor case that is connected to the third reference potential pad and the outer conductor of the coaxial cable and thereby surrounds a connecting portion of the coaxial cable.

9. An electronic apparatus according to claim 1, wherein each conductor is any one of a bump, a ball and solder.

10. An electronic apparatus according to claim 1, wherein the function module is a sensor module having the multilayer wiring unit formed with a thin film.

* * * * *